(12) United States Patent
Omata

(10) Patent No.: US 7,242,222 B2
(45) Date of Patent: Jul. 10, 2007

(54) OUTPUT CIRCUIT WITH REDUCED GATE VOLTAGE SWINGS

(75) Inventor: Tadahiro Omata, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 86 days.

(21) Appl. No.: 11/152,175

(22) Filed: Jun. 15, 2005

(65) Prior Publication Data
US 2006/0066353 A1   Mar. 30, 2006

(30) Foreign Application Priority Data
Sep. 30, 2004   (JP)   ............... 2004-288902

(51) Int. Cl.
H03K 19/094   (2006.01)
H03K 19/0175   (2006.01)
(52) U.S. Cl. .............. 326/83; 326/82; 326/26
(58) Field of Classification Search ........... 326/26–27, 326/30–34, 80–83; 327/108–112
See application file for complete search history.

(56) References Cited

U.S. PATENT DOCUMENTS 5,440,258 A * 8/1995 Galbi et al. ................ 327/112
6,967,501 B1 * 11/2005 Butka ........................ 326/30

FOREIGN PATENT DOCUMENTS

JP   2000-049584   2/2000

* cited by examiner

*Primary Examiner*—Anh Q. Tran
(74) *Attorney, Agent, or Firm*—Nixon Peabody LLP; Donald R. Studebaker

(57) ABSTRACT

An output circuit has an output transistor, or a complementary pair of output transistors, that generate a bi-level voltage signal with a high output level and a low output level. The signals applied to the gates of the output transistors have high and low levels that are more narrowly separated than are the output high and low levels. For example, one gate signal may swing between the output high level and an intermediate level, and another gate signal may swing between the output low level and the same or a different intermediate level. The relatively narrow voltage swing reduces current consumption, and the intermediate level or levels can be adjusted to adjust the rise time and fall time of the output signal.

4 Claims, 4 Drawing Sheets

OUTPUT CIRCUIT WITH REDUCED GATE VOLTAGE SWINGS

BACKGROUND OF THE INVENTION

1. Field of the Invention

The present invention relates to an output circuit in a semiconductor integrated circuit, more particularly to an output circuit with reduced power consumption.

2. Description of the Related Art

Conventional output circuits are generally structured as shown in FIG. 1, comprising a buffer B1 that receives an input signal S1 and drives two output transistors P3, N3. As shown in FIG. 2, the input signal S1, the signal SG1 applied to the gate electrodes of the output transistors P3, N3, and the output signal (OUT) all swing between the same power supply potential (VCC) and ground potential (GND). Since the output transistors are normally designed with large gate widths to provide adequate driving capability, the amount of current consumed in charging and discharging the capacitance of their gates is not negligible, particularly in a high-voltage output circuit.

Japanese Patent Application Publication No. 2000-49584 describes a high-voltage output circuit with a pair of level shifters that convert a narrow-swing input logic signal to two gate-driving signals, one with a raised high logic level, the other with a lowered low logic level. This scheme reduces the gate voltage swings, but the voltage shifters have fixed output ranges that overlap and cannot be adjusted.

SUMMARY OF THE INVENTION

An object of the present invention is to reduce the current consumed by charging and discharging the gate capacitance of the output transistors in an output circuit.

A further object is to enable the rise and fall times of the output signal of the output circuit to be adjusted.

The invented output circuit has an output transistor for output of a bi-level voltage signal that takes on a first potential level and a second potential level in response to an input signal that takes on the same two potential levels. The output transistor has a gate electrode, to which the output circuit applies a control signal that swings within a range that is disposed within and is narrower than the range from the first potential level to the second potential level.

In a preferred embodiment, the output circuit has a pair of output transistors of complementary conductive types connected in series. The output circuit includes a first power supply node supplying power at the first potential level, a second power supply node supplying power at the second potential level, and a third power supply node supplying power at a third potential level intermediate between the first and second potential levels. A first buffer, powered from the first and third power supply nodes, receives the input signal and drives the gate electrode of the first output transistor. A second buffer, powered from the second and third power supply nodes, receives the input signal and drives the gate electrode of the second output transistor. Alternatively, the second buffer may be powered from the second power supply node and a fourth power supply node that supplies power at a level intermediate between the second and third potential levels.

The third potential level, or the third and fourth potential levels, can be adjusted to adjust the rise and/or fall times of the voltage output signal.

The invented output circuit reduces power consumption by reducing the amount of current consumed in charging and discharging the gates of the output transistors, as compared with an output circuit in which the gate control signals take on the first and second potential levels.

DETAILED DESCRIPTION OF THE INVENTION

Figure 1:
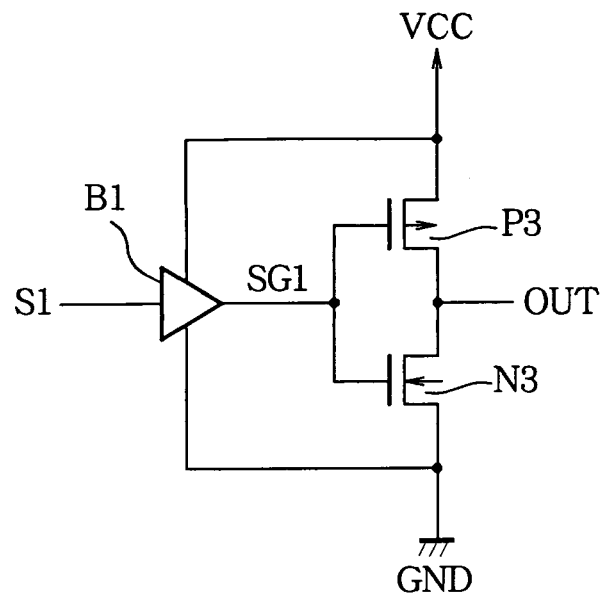
FIG. 1 is a circuit diagram illustrating a conventional output circuit.
Figure 2:
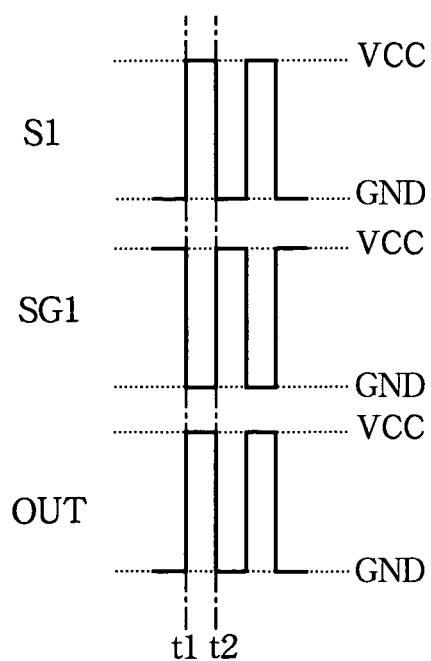
FIG. 2 is a waveform diagram illustrating the operation of the output circuit in FIG. 1.

Embodiments of the invention will now be described with reference to the attached drawings, in which like elements are indicated by like reference characters.

FIRST EMBODIMENT

Figure 3:
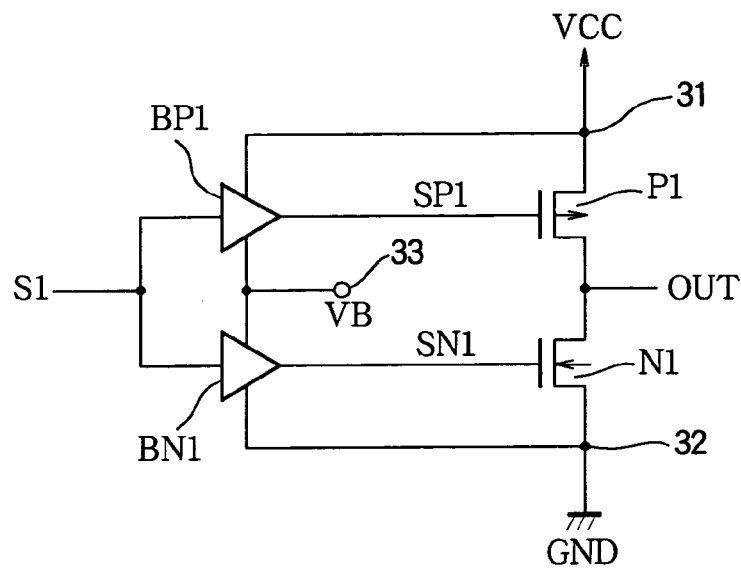
FIG. 3 is a circuit diagram illustrating an output circuit according to a first embodiment of the invention.

Referring to FIG. 3, the first embodiment is an output circuit with a p-channel metal-oxide-semiconductor (PMOS) output transistor P1, an n-channel metal-oxide-semiconductor (NMOS) output transistor N1, and a pair of buffer circuits BP1, BN1.

The output transistors P1, N1 have mutually interconnected drain electrodes, from which the output signal (OUT) of the output circuit is obtained. The source electrode of the PMOS output transistors P1 is connected to a power supply node 31 that supplies power at a positive potential level denoted VCC. The source electrode of the NMOS output transistors N1 is connected to a power supply node 32 that supplies power at the zero-volt or ground potential level, denoted GND.

Buffer circuit BP1 receives an input signal S1 and outputs a control signal SP1 from its output terminal to the gate electrode (hereinafter, simply "gate") of output transistor P1. Buffer circuit BN1 receives the same input signal S1 and outputs a control signal SN1 from its output terminal to the gate of output transistor N1. The input signal S1 is a bi-level signal that swings between the VCC and GND levels. The VCC potential is supplied from power supply node 31 to buffer circuit BP1 as its high-side power supply, and the ground potential (GND) is supplied from power supply node 32 to buffer circuit BN1 as its low-side power supply. Buffer circuit BP1 receives an intermediate potential VB from a power supply node 33 as its low-side power supply, while buffer circuit BN1 receives the same intermediate potential VB from power supply node 33 as its high-side power supply.

The intermediate potential VB satisfies the following condition (1), in which Vtp1 is the gate-source threshold voltage of output transistor P1 and Vtn1 is the gate-source threshold voltage of output transistor N1:

$$Vtn1 < VB < VCC - Vtp1 \tag{1}$$

For example, VB may be VCC/2.

Buffer circuits BP1 and BN1 operate as inverters: when the input signal S1 is high (VCC), buffer circuit BP1 outputs the intermediate potential (VB) and buffer circuit BN1 outputs the ground potential (GND); when the input signal S1 is low (GND), buffer circuit BP1 outputs the positive power-supply potential (VCC) and buffer circuit BN1 outputs the intermediate potential (VB). Both buffer circuits BP1 and BN1 comprise, for example, a PMOS transistor and an NMOS transistor (not shown) connected in series between the high-side power supply and the low-side power supply, both transistors receiving the input signal S1 at their gates, these transistors being smaller than the output transistors P1 and N1.

Figure 4:
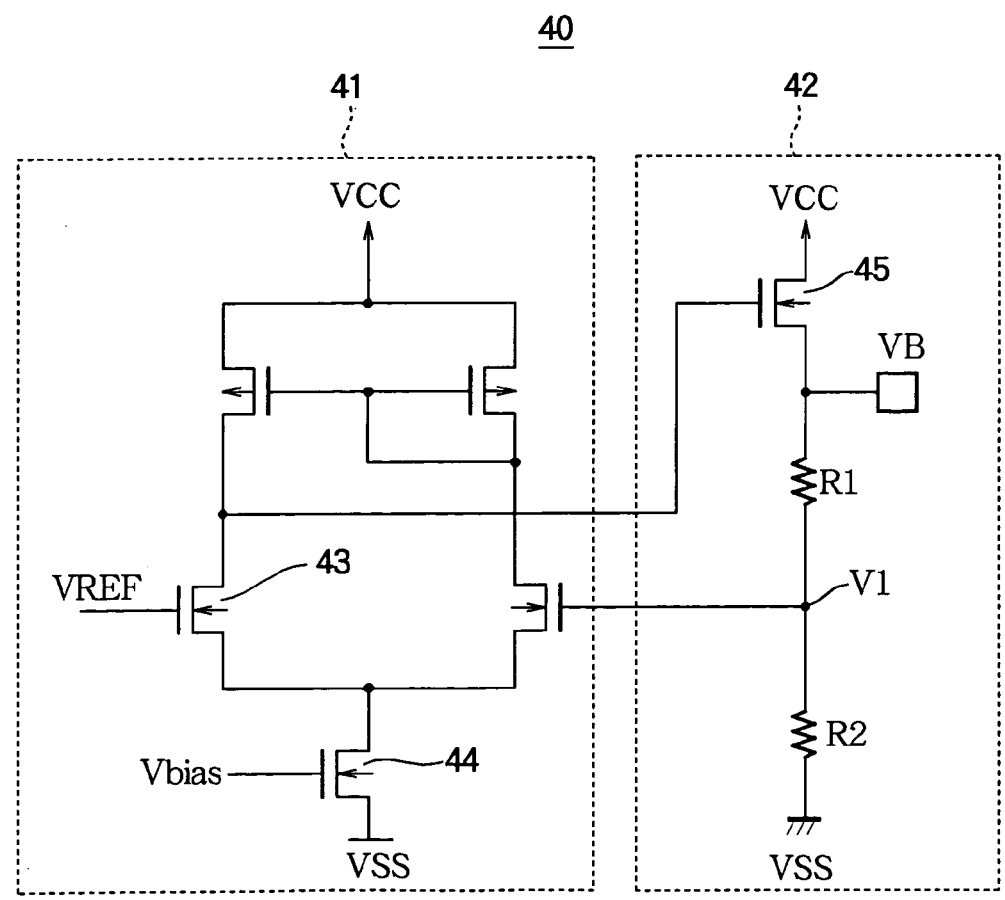
FIG. 4 is a circuit diagram illustrating a power supply circuit that can be used with the first and second embodiments.

The intermediate potential is generated by, for example, the power supply circuit 40 shown in FIG. 4, comprising a differential amplifier stage 41 and an output stage 42.

The differential amplifier stage 41 has a well-known circuit configuration including an NMOS input transistor 43 that receives a reference voltage VREF at its gate electrode, and an NMOS transistor 44 that receives a bias voltage Vbias at its gate electrode and functions as a current source. The bias voltage Vbias regulates the flow of current from the positive power supply VCC through the differential amplifier stage 41 to a potential VSS assumed here to be the zero-volt (ground) potential. The output of the differential amplifier stage 41 is taken from the drain of NMOS transistor 43 and supplied to the gate of a PMOS transistor 45 in the output stage 42.

The output stage 42 comprises this transistor 45 and a pair of resistors with resistance values R1, R2 connected in series with transistor 45 between the positive power supply VCC and ground VSS. The intermediate potential VB is taken from the drain of PMOS transistor 45. The potential V1 at a node between the two resistors is fed back to the differential amplifier stage 41. The VB and V1 potentials are related as follows:

$$VB=(1+(R1/R2))\times V1$$

The differential amplifier stage 41 operates so as to make V1 equal to the reference potential VREF. If VCC is thirty volts (30 V), VREF is (30/4) V, and R1=R2, then the intermediate voltage VB is 15 V ($2 \times V1 = 2 \times 30/4 = 15$), which is one-half of VCC.

Figure 5:
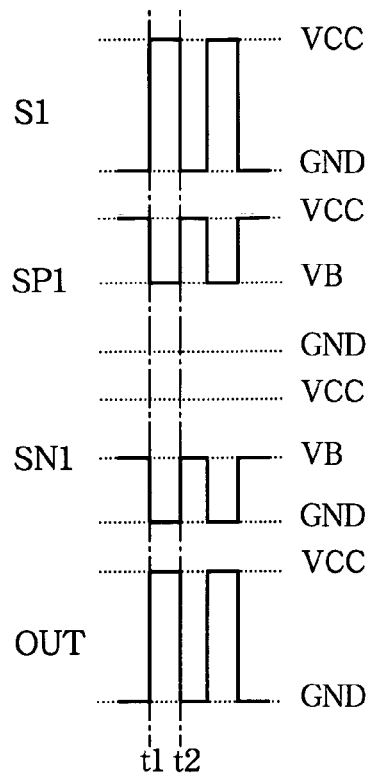
FIG. 5 is a timing waveform diagram illustrating the operation of the output circuit in FIG. 3.

The operation of the first embodiment is illustrated in FIG. 5. As the input signal S1 alternates between the VCC and GND levels, the output SP1 of buffer BP1 alternates in a complementary fashion between the VCC and VB levels, while the output SP2 of buffer BN1 alternates in the same complementary fashion between the VB and GND levels. When S1 goes high (VCC) at time t1, PMOS output transistor P1 turns on because its gate is at the VB level and its source is at the VCC level, NMOS output transistor N1 turns off because its gate and source are both at the ground level, and the voltage output signal (OUT) of the output circuit goes to the VCC level. When S1 goes low (GND) at time t2, PMOS output transistor P1 turns off because its gate and source are both at the VCC level, NMOS output transistor N1 turns on because its gate is at the VB level and its source is at the VCC level, and the voltage output signal of the output circuit goes to the GND level.

Since the buffers BP1, BN1 only have to drive the gates of the output transistors P1, N1, small buffer transistors suffice. The gate capacitances of the buffer transistors can be small enough that negligible current is consumed as they are charged and discharged by the input signal S1.

Since the voltage swings at the gates of the output transistors P1 and N1 are reduced from the conventional VCC value to values of (VCC−VB) and VB, respectively, the current consumed in charging and discharging the gate capacitances of the output transistors is considerably reduced, as compared with the conventional output circuit in FIG. 1.

If output transistors P1 and P3 in FIGS. 1 and 3 have the same gate capacitance Cp and output transistors N1 and N3 in FIGS. 1 and 3 have the same gate capacitance Cn, and if the input signal S1 switches between the VCC and GND levels at intervals of $\Delta t$, then the output gate charge-discharge current Ig1 in FIG. 1 is:

$$Ig1=\{(Cp\times VCC)+(Cn\times VCC)\}/\Delta t=(Cp+Cn)\times VCC/\Delta t$$

The corresponding current Ig2 in FIG. 3 is:

$$Ig2=\{(Cp\times(VCC-VB))+(Cn\times VB)\}/\Delta t$$

Under typical conditions (such as either VB=VCC/2 or Cp=Cn), Ig2 is one-half of Ig1. The actual reduction in current consumption is greater, because current discharged from the gate of output transistor P1 when the input signal S1 goes high flows through buffer BP1 to the intermediate potential (VB) node and can then be used to charge the gate capacitance of output transistor N1 through buffer BN1 when the input signal S1 goes low. If VB is VCC/2, this recycling of charge reduces the charge-discharge current in FIG. 3 to the following value Ig2', where max denotes the maximum of the quantities enclosed in the braces:

$$Ig2'=\max\{(Cp\times VCC/2)/\Delta t, (Cn\times VCC/2)/\Delta t\}$$

A further advantage of the first embodiment is that the intermediate voltage VB can be varied within the range given by equation (1) to achieve various effects. Specifically, the output signal (OUT) can be made to rise faster than it falls (if VB<VCC/2) or to fall faster than it rises (if VB>VCC/2). These rise-time and fall-time adjustments can be made by adjusting the reference voltage VREF in FIG. 4.

SECOND EMBODIMENT

Figure 6:
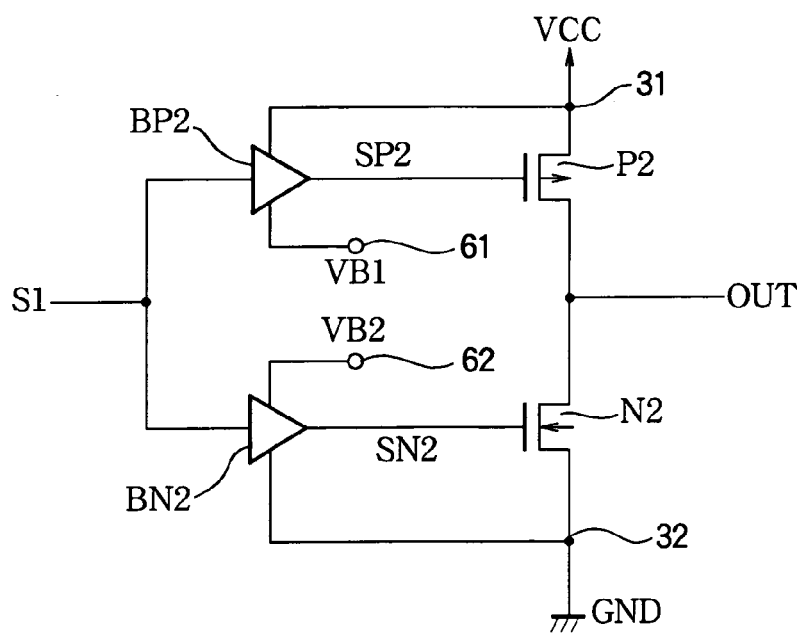
FIG. 6 is a circuit diagram illustrating an output circuit according to a second embodiment of the invention.

Referring to FIG. 6, the second embodiment comprises a pair of output transistors P2, N2 similar to the output transistors P1, N1 in the first embodiment, and a pair of buffers BP2, BN2 similar to the buffers BP1, BN1 in the first embodiment, with the same connections to power supply nodes 31 and 32. The difference between the first embodiment and the second embodiment is that separate intermediate potentials VB1, VB2 are supplied to the two buffers BP2, BN2 from a pair of power supply nodes 61, 62.

The intermediate potential VB1 supplied to buffer BP2 as its low-side power supply satisfies the following condition, in which Vtp2 is the threshold gate-source voltage of output transistor P2:

$$VB1<VCC-Vtp2 \qquad (2)$$

The intermediate potential VB2 supplied to buffer BN2 as its high-side power supply satisfies the following condition, in which Vtn2 is the threshold gate-source voltage of output transistor N2:

$$VB2>Vtp2 \qquad (3)$$

VB1 is preferably higher than VB2. The intermediate potentials VB1 and VB2 can be selected so as to minimize the gate voltage swings at the output transistors P2, N2 by setting VB1 as close as possible to VCC, consistent with a satisfactory rise time of the output signal (OUT), and setting VB2 as close as possible to GND, consistent with a satisfactory fall time of the output signal (OUT).

Figure 7:
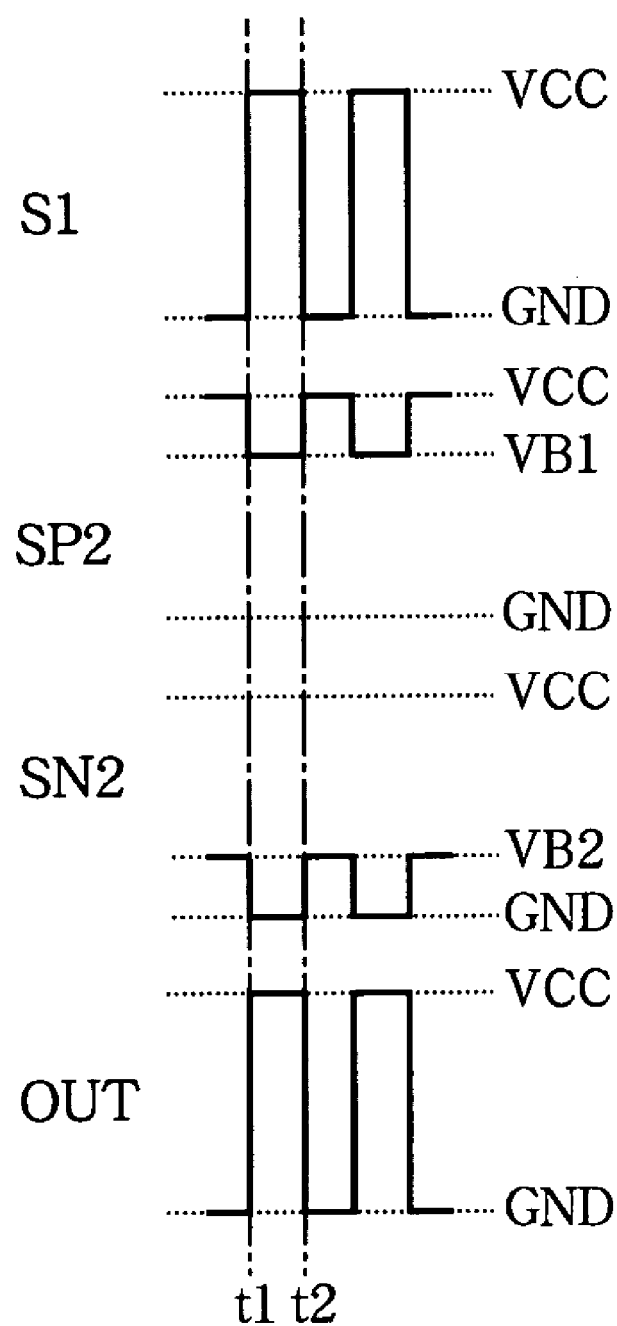
FIG. 7 is a timing waveform diagram illustrating the operation of the output circuit in FIG. 6.

The operation of the second embodiment is generally similar to the operation of the first embodiment. Referring to FIG. 7, as the input signal S1 swings between the VCC and GND levels, the signal SP2 output from buffer BP2 to the gate of output transistor P2 swings in complementary fashion between the VCC and VB1 levels, and the signal SN2 output from buffer BN2 to the gate of output transistor N2 swings in complementary fashion between the VB2 and GND levels. Output transistors P1 and N1 switch on and off alternately, causing the output signal (OUT) to swing between the VCC and GND levels in the same way as the input signal S1. For example, the input signal S1 and output signal OUT both go to the VCC level at time t1 and to the GND level at time t2.

If the VCC, VB1, and VB2 potentials have the following values with respect to ground (GND=0 V), $$VCC=30\ V$$

$$VB1=25\ V$$

$$VB2=5\ V$$

then the charge-discharge current is reduced by a factor of six as compared with the conventional circuit in FIG. 1. With the same notation as in the first embodiment:

$$Ig1=\{(Cp\times VCC)+(Cn\times VCC)\}/\Delta t=30\times(Cp+Cn)/\Delta t$$

$$Ig2=\{(Cp\times(VCC-VB1))+(Cn\times VB2)\}/\Delta t=5\times(Cp+Cn)/\Delta t=Ig1/6$$

(Cp now denotes the gate capacitance of output transistors P2 and P3, while Cn denotes the gate capacitance of output transistors N2 and N3.)

A further advantage of the second embodiment is that the two intermediate voltages VB1 and VB2 can be adjusted independently within the ranges given by the inequalities (2) and (3) above to adjust the rise time and fall time of the output signal (OUT) independently.

Although the second embodiment requires a pair of power supply circuits such as the one shown in FIG. 4 to generate the two intermediate voltages VB1 and VB2, in typical applications, the invented output circuit will be one of a number of similar output circuits that can share the same pair of power supply circuits.

Although the embodiments above are complementary circuits including both p-channel and n-channel output transistors, the invention is also applicable to open-drain output circuits with only a single p-channel or n-channel output transistor, in which case only a single buffer is required.

Although the invention is particularly effective in reducing the power consumption of relatively high-voltage output circuits, it can be applied to any output circuit that generates a bi-level voltage output signal, provided the two output levels leave room for an intermediate voltage VB or a pair of intermediate voltages VB1, VB2 within the ranges given by equations (1), (2), and (3) above.

Those skilled in the art will recognize that further variations are possible within the scope of the invention, which is defined in the appended claims.

What is claimed is:

1. An output circuit for output of a bi-level voltage signal taking on a first potential level and a second potential level in response to an input signal that likewise takes on the first potential level and the second potential level, comprising:
    a first transistor of a first conductive type having a source electrode receiving the first potential level and having a first gate electrode;
    a second transistor of a second conductive type having a source electrode receiving the second potential level and having a second gate electrode; and
    means for applying to the first gate electrode a first control signal that swings between the first potential level and a third potential level intermediate between the first potential level and the second potential level, and applying to the second gate electrode a second control signal that swings between the third potential level and the second potential level;
    the first transistor and the second transistor also having interconnected drain electrodes for output of the bi-level voltage signal.

2. The output circuit of claim 1, wherein the means for applying includes:
    a first power supply node supplying power at the first potential level;
    a second power supply node supplying power at the second potential level;
    a third power supply node supplying power at the third potential level;
    a first buffer receiving the input signal, receiving power from the first power supply node and the third power supply node, and having an output terminal connected to the first gate electrode; and
    a second buffer receiving the input signal, receiving power from the third power supply node and the second power supply node, and having an output terminal connected to the second gate electrode.

3. The output circuit of claim 1, further comprising means for adjusting the third potential level, thereby adjusting a rising or falling characteristic of the voltage signal output by the output circuit.

4. The output circuit of claim 3, wherein the means for adjusting the third potential level comprises a power supply circuit that generates the third potential level according to an adjustable reference voltage.

* * * * *